(12) United States Patent
Bouillet et al.

(10) Patent No.: US 6,445,423 B1
(45) Date of Patent: Sep. 3, 2002

(54) CONTROLLED OSCILLATOR IN A DIGITAL SYMBOL TIMING RECOVERY NETWORK

(75) Inventors: Aaron Reel Bouillet, Noblesville; David Glen White, Indianapolis, both of IN (US)

(73) Assignee: Thomson Licensing S.A., Boulogne (FR)

( * ) Notice: Subject to any disclaimer, the term of this patent is extended or adjusted under 35 U.S.C. 154(b) by 0 days.

(21) Appl. No.: 09/351,065

(22) Filed: Jul. 9, 1999

(51) Int. Cl.[7] .............................................. H04N 5/455
(52) U.S. Cl. ...................... 348/537; 348/726; 375/321; 375/326
(58) Field of Search ................................. 348/725, 726, 348/536, 537, 720, 735; 375/326, 316, 327, 344, 345, 270, 355, 324, 321; H04N 5/455

(56) References Cited

U.S. PATENT DOCUMENTS

| 5,581,585 | A | | 12/1996 | Takatori et al. ............. 375/376 |
|---|---|---|---|---|
| 5,859,671 | A | * | 1/1999 | Kim ............................ 348/537 |
| 5,872,815 | A | | 2/1999 | Strolle et al. ................ 375/321 |
| 5,892,632 | A | | 4/1999 | Behrens et al. ............... 360/51 |
| 6,233,295 | B1 | * | 5/2001 | Wang .......................... 348/726 |
| 6,275,554 | B1 | * | 8/2001 | Bouillet et al. ............. 375/321 |
| 6,356,598 | B1 | * | 3/2002 | Wang .......................... 348/725 |

OTHER PUBLICATIONS

Wayne Bretl et al., VSB Modem Subsystem Design For Grand Alliance Digital Television Receivers, IEEE Transactions on Consumer Electronics, vol. 41, No. 3, Aug. 1995, pp. 773–786.
Grand Alliance HDTV System Specification (Draft Document), Submitted to the ACATS Technical Subgroup, Feb. 22, 1994 and the 1994 Proceedings of the 48th Annual Broadcast Engineering Conference, Las Vegas, Nevada, Mar. 20, 1994, figs.9 and 12, p. 10.

* cited by examiner

Primary Examiner—Sherrie Hsia
(74) Attorney, Agent, or Firm—Joseph S. Tripoli; Eric P. Herrmann; Ronald H. Kurdyla

(57) ABSTRACT

A receiver for processing a VSB modulated signal containing terrestrial broadcast high definition television information includes an input analog-to-digital converter (19) for producing a digital datastream. A symbol timing recovery and segment sync recovery network (24; FIG. 3, 4) develops a properly timed sampling clock for the digital converter (19). The symbol timing recovery network (310) responds to an output from the segment sync recovery network (328), which in turn responds to an equalized signal from an adaptive channel equalizer (34). A controlled oscillator (336) generates the sampling clock for the digital converter. A control network (340, 344, 348; FIG. 3) shifts the frequency range of the oscillator to maintain desired linear operation to enhance symbol timing acquisition.

6 Claims, 3 Drawing Sheets

CONTROLLED OSCILLATOR IN A DIGITAL SYMBOL TIMING RECOVERY NETWORK

FIELD OF THE INVENTION

This invention concerns a digital symbol timing recovery network.

BACKGROUND OF THE INVENTION

The recovery of data from modulated signals conveying digital information in symbol form usually requires three functions at a receiver: timing recovery for symbol synchronization, carrier recovery (frequency demodulation to baseband), and channel equalization. Timing recovery is a process by which a receiver clock (timebase) is synchronized to a transmitter clock. This permits a received signal to be sampled at optimum points in time to reduce slicing errors associated with decision-directed processing of received symbol values. Carrier recovery is a process by which a received RF signal, after being frequency down converted to a lower intermediate frequency passband (eg., near baseband), is frequency shifted to baseband to permit recovery of the modulating baseband information. Adaptive channel equalization is a process by which the effects of changing conditions and disturbances in the signal transmission channel are compensated for. This process typically employs filters that remove amplitude and phase distortions resulting from frequency dependent time variant characteristics of the transmission channel.

SUMMARY OF THE INVENTION

In accordance with the principles of the present invention, a symbol timing recovery network in a digital signal processing system includes a controlled oscillator for providing a signal sampling clock. In addition to controlling the oscillator frequency within a given frequency range, the oscillator frequency range is controllably shifted to maintain desired linear operation for enhancing symbol timing acquisition.

DETAILED DESCRIPTION OF THE DRAWING

Figure 1:
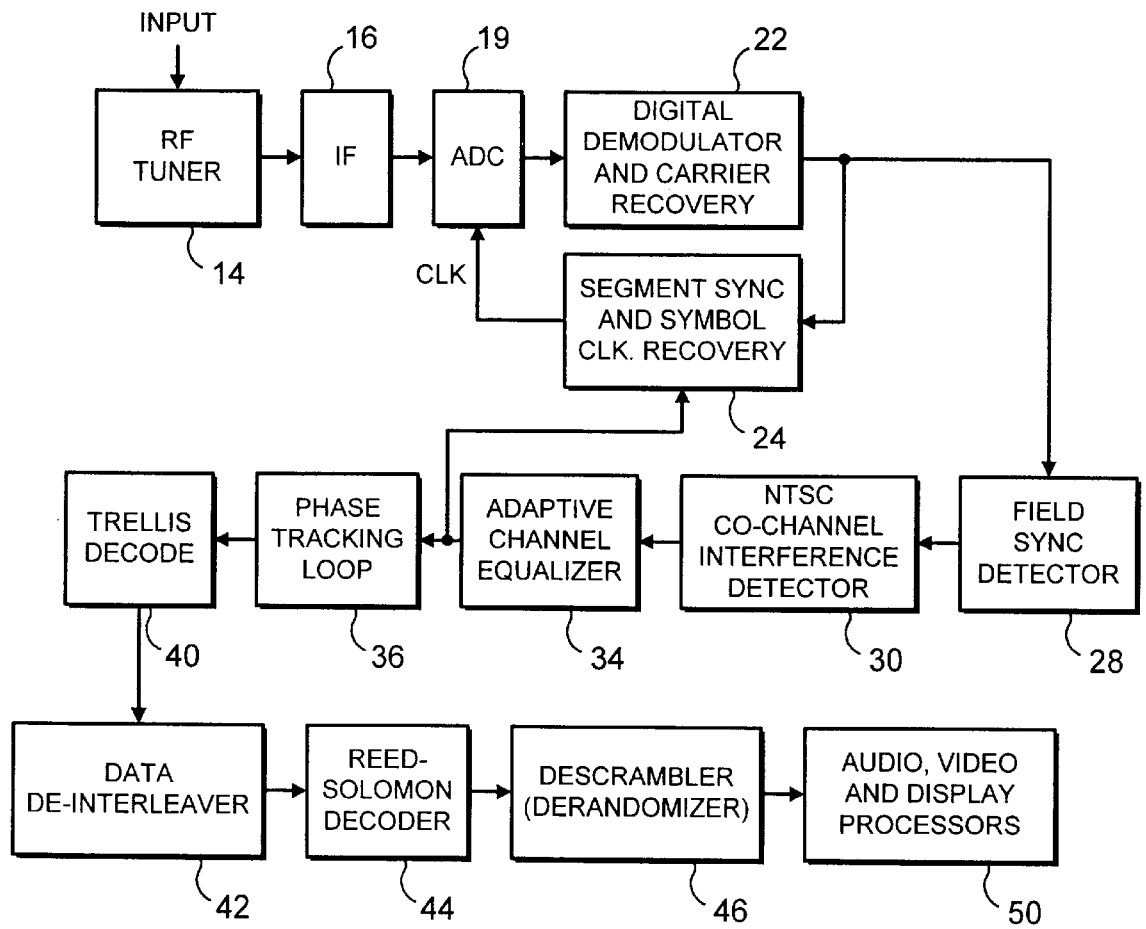
FIG. 1 is a block diagram of a portion of a high definition television (HDTV) receiver including timing recovery apparatus according to the principles of the present invention.

In FIG. 1, a terrestrial broadcast analog Input HDTV signal is processed by an input network 14 including radio frequency (RF) tuning circuits and an intermediate frequency (IF) processor 16 including a double conversion tuner for producing an IF passband output signal, and appropriate automatic gain control (AGC) circuits. In this embodiment the received signal is a carrier suppressed multi-level 8-VSB modulated signal as proposed by the Grand Alliance and adopted for use in the United States. Such a VSB signal is represented by a one-dimensional data symbol constellation wherein only one axis contains quantized data to be recovered by the receiver. To simplify the Figure, signals for clocking the illustrated functional blocks are not shown.

Figure 2:
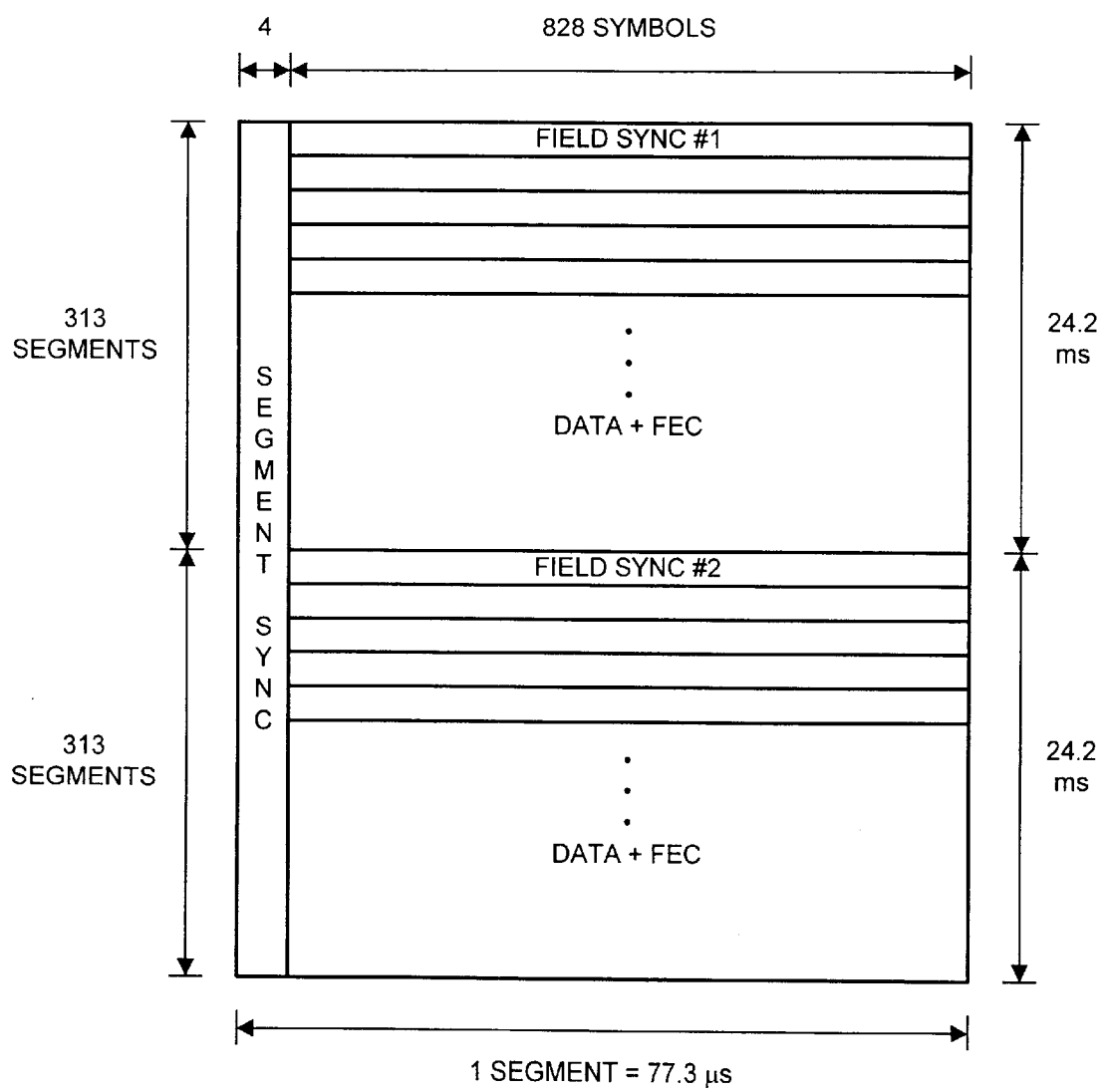
FIG. 2 depicts a data frame format for a VSB modulated signal according to the Grand Alliance HDTV terrestrial broadcast system in the United States.

As described in the Grand Alliance HDTV System Specification dated Apr. 14, 1994, the VSB transmission system conveys data with a prescribed data frame format as shown in FIG. 2. A small pilot signal at the suppressed carrier frequency is added to the transmitted signal to help achieve carrier lock at a VSB receiver. Referring to FIG. 2, each data frame comprises two fields with each field including 313 segments of 832 multilevel symbols. The first segment of each field is referred to as a field sync segment, and the remaining 312 segments are referred to as data segments. The data segments typically contain MPEG compatible data packets. Each data segment comprises a four symbol segment sync component followed by 828 data symbols. Each field segment includes a four symbol segment sync component followed by a field sync component comprising a predetermined 511 symbol pseudorandom number (PN) sequence and three predetermined 63 symbol PN sequences, the middle one of which is inverted in successive fields. A VSB mode control signal (defining the VSB symbol constellation size) follows the last 63 PN sequence, which is followed by 96 reserved symbols and 12 symbols copied from the previous field.

Continuing with FIG. 1, the passband IF output signal from unit 16 is converted to a digital symbol datastream by an analog to digital converter 19. The output digital datastream from ADC 19 is demodulated to baseband by a demodulator/carrier recovery network 22. This is done by a phase locked loop in response to the small reference pilot carrier in the received VSB datastream. Unit 22 produces an output I-phase demodulated symbol datastream. Unit 22 may include a demodulator of the type described in the Grand Alliance system specification, or of the type described in copending U.S. patent application Ser. No. 09/140,257 of T. J. Wang filed Aug. 26, 1998, U.S. Pat. No. 6,233,295.

Associated with ADC 19 is a segment sync generator and symbol clock recovery network 24 in accordance with the present invention. Network 24 recovers the repetitive data segment sync components of each data frame from the received random data. The segment syncs are used to regenerate a properly phased clock, eg., 10.76 Msymbols/sec, which is used to control the datastream symbol sampling by analog to digital converter 19. As will be discussed in connection with FIGS. 3 and 4, network 24 uses a four symbol correlation reference pattern and associated symbol data correlator to detect the segment sync.

Unit 28 detects the data field sync component by comparing every received data segment with an ideal field reference signal stored in memory in the receiver. In addition to field synchronization, the field sync signal provides a training signal for adaptive channel equalizer 34. NTSC co-channel interference detection and rejection are performed by unit 30. Afterwards, the signal is adaptively equalized by channel equalizer 34 which operates in blind and subsequent decision-directed modes. Equalizer 34 may be of the type described in the Grand Alliance HDTV System Specification and in an article by W. Bretl et al., "VSB Modem Subsystem Design for Grand Alliance Digital Television Receivers," IEEE Transactions on Consumer Electronics, August 1995. Equalizer 34 also may be of the type described in copending U.S. patent application Ser. No. 09/102,885 of Shiue et al. The output of equalizer 34 advantageously assists the operation of network 24 as will be discussed.

Equalizer 34 corrects channel distortions, but phase noise randomly rotates the symbol constellation. Phase tracking network 36 removes the residual phase and gain noise in the output signal from equalizer 34, including phase noise which has not been removed by the preceding carrier recovery network in response to the pilot signal. The phase corrected signal is then trellis decoded by unit 40, de-interleaved by unit 42, Reed-Solomon error corrected by unit 44, and descrambled (de-randomized) by unit 46 using well known procedures. Afterwards, a decoded datastream is subjected to audio, video and display processing by unit 50. The functional blocks of FIG. 1, with the exception of timing recovery network 24 as modified in accordance with the principles of the present invention, may employ circuits of the type described in the Grand Alliance HDTV System Specification of Apr. 4, 1994, and in the Bretl, et al. article mentioned above.

Demodulation in unit 22 is performed by an automatic phase control (APC) loop to achieve carrier recovery using known techniques. The phase locked loop uses the pilot component as a reference for initial acquisition, and a normal phase detector for phase acquisition. The pilot signal is embedded in the received datastream, which contains data exhibiting a random, noise-like pattern. The random data is essentially disregarded by the filtering action of the demodulator APC loop. The 10.76 Msymbols/sec input signal to ADC 19 is a near baseband signal with the center of the VSB frequency spectrum at 5.38 MHz and the pilot component situated at 2.69 MHz. In the demodulated datastream from unit 22 the pilot component has been frequency shifted down to DC. The demodulated datastream is applied to segment sync and symbol clock timing recovery unit 24 as shown in detail in FIG. 3. When the repetitive data segment sync pulses are recovered from the random data pattern of the received datastream, the segment syncs are used to achieve proper symbol timing by regenerating a properly phased symbol rate sampling clock for controlling the sampling operation of analog to digital converter 19.

Figure 4:
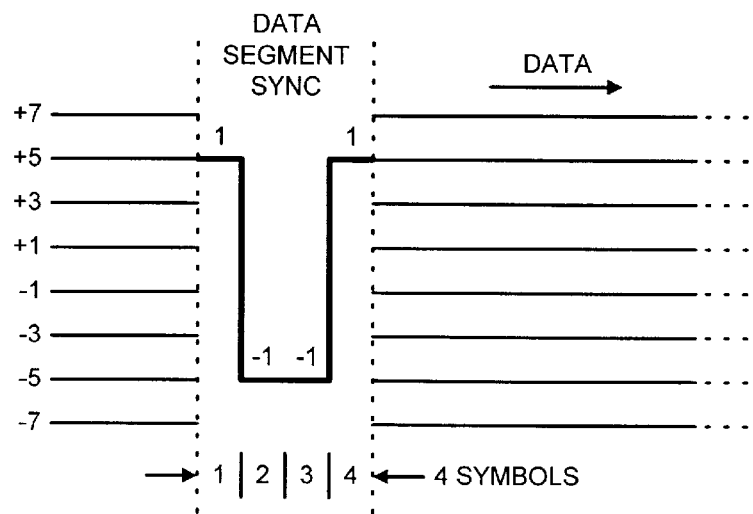
FIG. 4 depicts a signal waveform helpful in understanding the operation of the network in FIG. 3.

FIG. 4 depicts a portion of an eight level (−7 to +7) data segment with an associated segment sync, for an 8-VSB modulated terrestrial broadcast signal in accordance with the Grand Alliance HDTV specification. The segment sync occurs at the beginning of each data segment and occupies a four symbol interval. The segment sync is defined by a pattern 1 −1 −1 1 corresponding to the amplitude levels of the segment sync pulse, from +5 to −5.

The four symbol segment sync occurs every 832 symbols but is difficult to locate in a demodulated VSB digital datastream since the data has a random, noise-like characteristic. To recover the segment sync under these conditions, the demodulated I channel datastream is applied to one input of a data correlator, and a reference pattern having the 1 −1 −1 1 characteristic is applied to a reference input of the correlator for comparison with the demodulated data. The correlator produces reinforcement consistent with the reference pattern every 832 symbols. Reinforced data events are accumulated by an accumulator associated with the correlator. Intervening random (non-reinforced) correlations disappear relative to the reinforced correlated segment sync components. This procedure is well known. Networks for recovering segment sync data in this manner are known, for example, from the Grand Alliance HDTV specification and from the Bretl, et al. article mentioned previously.

Figure 3:
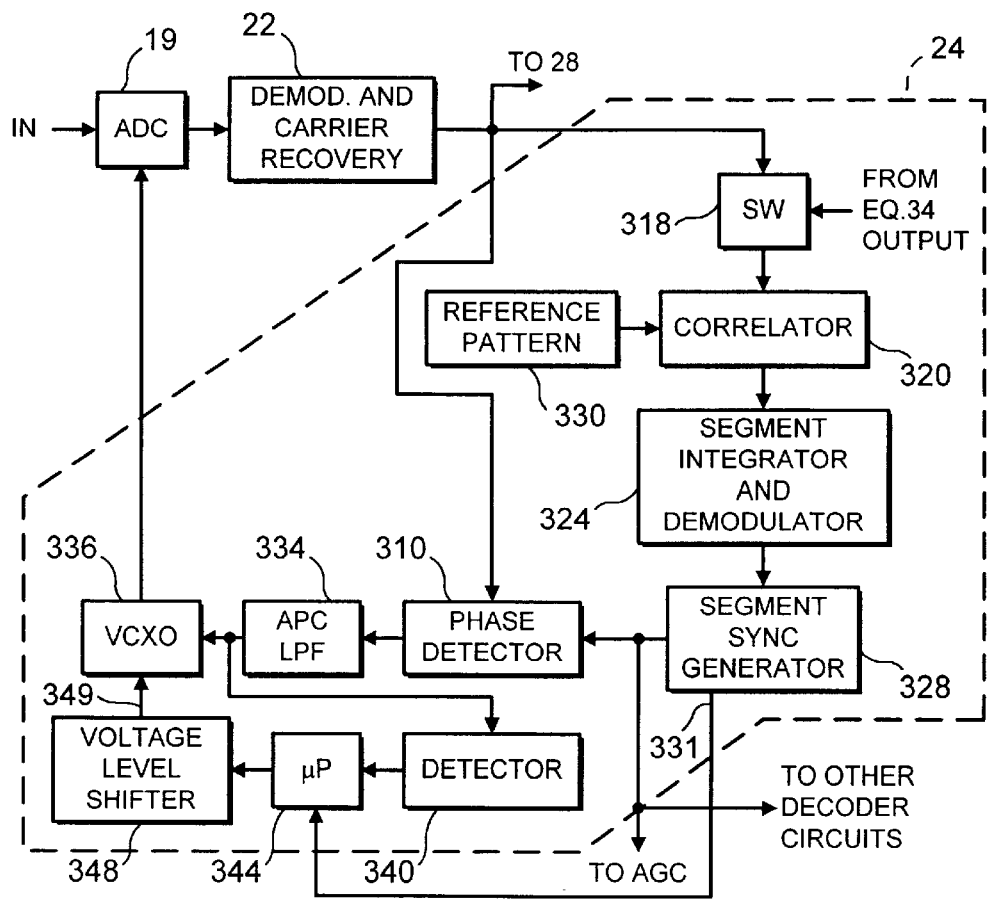
FIG. 3 shows details of a segment sync detector and symbol clock timing recovery network in FIG. 1.

FIG. 3 shows details of segment sync and timing recovery network 24. The output datastream from demodulator 22 is applied to one signal input of phase detector 310, and to a switch 318. Switch 318 may be programmed to convey either the output signal from demodulator 22 or the output signal from equalizer 34 to an 832 symbol correlator 320 in a segment sync recovery path. The other signal input of phase detector 310 receives an output signal from segment sync generator 328 in the segment sync recovery path including correlator 320. Correlation reference pattern generator 330 coupled to a reference input of correlator 320, and segment integrator and accumulator 324. Reference pattern generator 330 provides the 1 −1 −1 1 segment sync reference pattern (see FIG. 4).

The output from correlator 320 is integrated and accumulated by unit 324. Segment sync generator 328 includes a comparator with a predetermined threshold and responds to the output of unit 324 by generating segment sync components at appropriate times in the datastream corresponding to segment sync intervals. This occurs when the accumulation of reinforced data events (segment sync appearances) exceeds the predetermined threshold. Generation of segment sync components signifies that the signal has been acquired. This event is indicated by data stored in a register in generator 328. This register is monitored by controller 344 to determine whether or not signal acquisition has occurred, as will be discussed.

Phase detector 310 performs a timing recovery function. Phase detector 310 compares the phase of segment sync generated by unit 328 with the phase of segment sync appearing in the demodulated datastream from unit 22, and produces an output phase error signal which represents symbol timing error. This error signal is low pass filtered by automatic phase control (APC) filter 334 to produce a signal suitable for controlling a 10.76 MHz voltage controlled crystal oscillator (VCXO) 336. Oscillator 336 provides the 10.76 MHz symbol sampling clock for ADC 19. This sampling clock exhibits proper timing when the phase error signal is substantially zero by APC action, indicating that symbol timing (clock) recovery is complete. The segment sync produced by unit 328 is also applied to other decoder circuits and automatic gain control (AGC) circuits (not shown). The output of filter 334 is applied to an input of detector 340. Output 331 of sync generator 328 indicating whether or not signal lock (acquisition) has been achieved, is applied to an input of microcontroller 344.

Switch 318 is optional but may be programmed to convey either the output of demodulator 22 or the output of equalizer 34 to correlator 320 in the sync recovery path. In the illustrated preferred embodiment, switch 318 is programmed to continuously couple the output of adaptive equalizer 34 to correlator 320. In another system with different operating requirements, for example, switch 318 may be programmed to initially couple the output of demodulator 322 to correlator 320 when the system is first energized or when the system is reset, and to subsequently couple the output of equalizer 34 to correlator 320 after a predetermined time interval.

In the preferred embodiment of FIG. 3, initially, when the system is first energized or after the system is reset, VCO 336 is set to operate at a predetermined stable frequency. In this example this frequency corresponds to one of the extreme (maximum or minimum) frequency values within a predetermined frequency range. This initial frequency is significantly offset from the desired symbol timing frequency or a multiple thereof because it has been observed that equalizer 34 converges more rapidly in a blind operating mode by using such an initial frequency rather than an initial frequency that is too close to the desired timing frequency. With the equalizer output being coupled via switch 318 to correlator 320, equalizer 34 is reset and allowed to converge for a predetermined (programmed) amount of time, eg., 50 milliseconds. This interval is chosen to correspond to a time required for the equalizer to exhibit sufficiently stable operation. This interval may be determined empirically in accordance with the requirements of a particular system. At this time, when equalizer operation has stabilized, the phase control network including units 320, 324,328 and 310 is reset and permitted to control the operation of oscillator 336 via filter 334 and control voltage input 349 of oscillator 336. Oscillator 336 begins operation from the initial (reset) predetermined frequency condition mentioned above.

The described control mechanism improves the performance of the timing recovery network because its input data has had channel impairments such as multipath images significantly reduced or removed by equalizer 34. Specifically, this timing control mechanism improves the ability of the network to acquire and retain the signal under strong multipath conditions. The ability of the disclosed arrangement to recover the segment sync in the presence of adverse conditions such as strong multipath enhances the speed and accuracy of the symbol timing recovery process.

When signal acquisition begins, adaptive equalizer 34 operates in a blind mode using a known blind equalization algorithm such as the constant modulus algorithm (CMA), for example. After some time has elapsed, eg., 50 ms, the equalizer output is considered to be good enough to assist the segment sync and timing recovery processes for developing an appropriate sampling clock from oscillator 336. After symbol timing and the appropriate sampling clock for ADC unit 19 have been established, network 24 continues to receive the equalized output signal from equalizer 34 to improve tracking performance, eg., in the presence of strong multipath signal conditions. At this time equalizer 34 typically operates in a steady-state decision-directed mode.

In accordance with a feature of the FIG. 3 arrangement, a DC control voltage 349 from unit 348 is used to shift the operating frequency range of oscillator 336. This is accomplished by a network including detector 340, microcontroller 344, and voltage level shifter 348. This network improves symbol acquisition performance and frequency acquisition range as explained below. Detector 340 essentially detects the steady-state operating condition of oscillator 336 by sensing a predetermined DC level at the output of filter 334.

Sync generator 328 provides an output signal 331 indicating that signal acquisition has been achieved. Controller 344 responds to the output signal from detector 340 and to output signal 331 from sync generator 328 for causing level shifter 348 to produce a control voltage 349 which causes oscillator 336 to shift its operating frequency range until a steady state operating frequency is achieved. The signal acquisition process is repeated after each time the oscillator operating frequency range is shifted. Repeating the signal acquisition process involves resetting the network elements and setting VCO 336 to operate at a predetermined initial frequency, as discussed above.

Voltage controlled crystal oscillators (VCXOs) such as employed by oscillator 336 often have a limited frequency range over which the oscillator can operate with suitable linearity in the control voltage vs. output frequency transfer function, or response curve. To increase this linear frequency operating range, if signal acquisition has not been achieved within a given time, DC control voltage 349 from unit 348 shifts the oscillator transfer function to a different frequency range without changing the desired linearity characteristic. This frequency range shifting ability adjusts the oscillator steady state operating voltage associated with a correct steady state frequency to produce more reliable symbol timing acquisition.

The arrangement of detector 340, microcontroller 344 and level shifter 348 permits symbol timing to be acquired over a wider frequency range than would otherwise be possible in a conventional configuration without these elements, ie., with oscillator 336 being controlled by the output of filter 334 alone. In a conventional configuration, if the range of frequencies produced by oscillator 336 in response to the output of filter 334 did not include the actual symbol frequency of the received symbols, the timing loop would not lock and sampling provided by ADC 19 would be compromised. Furthermore, the linearity of the oscillator frequency vs. control voltage response may be degraded as the control voltage deviates from its mean value. This effect may result in degraded acquisition performance of the timing recovery network when steady state oscillator operation requires a frequency control voltage (from filter 334) close to its extreme (maximum or minimum) values. The network including elements 340, 344, and 348 significantly reduces or eliminates these performance degradations, as follows.

Microcontroller 344 maintains current operating conditions when the control signals from detector 340 and generator 328 indicate that a received signal has been properly acquired, but shifts the frequency range of oscillator 336 up or down via unit 348 when signal acquisition has not occurred within a predetermined time.

When the operation of microcontroller 344 is initialized, eg., after being reset, controller 344 causes voltage shifter 348 to output a predetermined, nominal DC voltage in accordance with the parameters of oscillator 336 and the operating parameters of the overall system. This nominal control voltage causes oscillator 336 to center its the control voltage vs. output frequency transfer function at its nominal position. Symbol timing recovery is then attempted via elements 320, 324, 328 and 330 as discussed. If recovery fails because the actual symbol timing frequency is beyond the current frequency range of oscillator 336, controller 344 will direct unit 348 to produce a different control voltage, resulting in a different frequency range being covered by the oscillator control voltage vs. frequency response. This new range may include the actual symbol timing frequency. The frequency range is shifted if signal acquisition is not achieved within a predetermined "time out" period. As noted above, controller 344 monitors the output of filter 334 and a register in sync generator 328 to determine if signal acquisition has been achieved, ie., as manifested by the sync recovered by generator 328 being coincident with segment sync intervals. If signal recovery is not achieved within the "time out" period, a different oscillator frequency range is selected as discussed above and the signal acquisition process is repeated. The frequency range will not be shifted if, after the predetermined time, the output of filter 334 indicates that oscillator 336 is in a steady state operating condition and control voltage 331 indicates that segment sync has been recovered.

In an alternative embodiment, failure to acquire the signal may indicated by a high error output from Reed-Solomon error detecting and correcting unit 44 (FIG. 1), which may monitored by microcontroller 344. Signal acquisition would be indicated when the Reed-Solomon error detector indicates negligible error in the signal, whereby the operation of oscillator 336 would be remain unchanged.

When symbol timing is first acquired for a particular channel, the symbol timing frequency will be unknown. Although the transmitter and receiver symbol frequencies should be the same, significant variations can occur at the receiver. In this case, after each acquisition failure, a predetermined search instruction, or algorithm, is implemented by controller 344 to determine the next centering control voltage to be used, ie., greater or less than the initial value. For example, in a simple case, only two control voltages will be available from level shifter 348 in response to instructions from controller 344. Acquisition is first attempted using the initial, or default, control voltage. If that attempt fails to achieve timing lock, the second control voltage and associated frequency range will be used in response to a command from controller 344. In more complex systems, three or more control voltages and associated frequency ranges may be available from shifter 348.

After a channel signal has been acquired the first time, detector 340 compares the steady state voltage output from filter 334 to a locally provided reference voltage that represents the optimal voltage within a small predetermined operating range. Controller 344 stores in memory the direction the oscillator voltage vs. frequency transfer function should be adjusted to place the control voltage from unit 348 closer to a predetermined optimum value. Controller 344 will use this control voltage value as the default value the next time this channel is acquired.

The described shifting operation advantageously expands the range of symbol frequencies that can be acquired. Also, a best estimate may be used after the first acquisition, rather than starting the search for the optimal oscillator control voltage vs. frequency centering voltage from the same point when acquiring a channel. In addition, the oscillator control voltage is shifted toward its optimal value for acquisition, removing some dependency on the accuracy of the actual symbol timing frequency and variations in the oscillator voltage vs. frequency response caused by implementation tolerances such as component value tolerances, for example.

What is claimed is:

1. Apparatus for processing a symbol datastream, comprising:

an analog to digital converter for converting said datastream to a digital signal;

a source of timing signal coupled to a clock input of said converter;

a symbol timing recovery network responsive to said digital signal from said converter for providing a frequency control signal to said source; and a control network responsive to said digital signal for providing an additional control signal for shifting the operating frequency range of said source.

2. Apparatus according to claim 1, wherein said source is a variable frequency oscillator;

said timing recovery network comprises a phase detector;

said timing signal is a sample clock for said converter; and said additional control signal shifts the frequency vs control signal transfer function of said oscillator.

3. Apparatus according to claim 1, wherein said datastream comprises a Vestigial Sideband (VSB) modulated signal containing high definition video data represented by a multi level symbol constellation, said data having a data frame format constituted by a succession of data frames comprising a field sync component prefacing a plurality of data segments having an associated segment sync component; and said apparatus further includes a segment sync recovery network responsive to said digital signal from said converter for providing a recovered segment sync component; and said additional control signal is produced as a function of said recovered segment sync component.

4. A method for processing a symbol datastream comprising the steps of:

generating a sampling clock;

sampling said datastream in response to said sampling clock;

generating a first control signal for controlling the frequency of said sampling clock; and generating a second control signal for shifting the operating frequency range of said sampling clock.

5. A method according to claim 4, wherein said step for generating a first control signal includes the step of recovering timing information from said datastream.

6. A method according to claim 4 wherein said datastream comprises a multi level Vestigial Sideband (VSB) modulated signal containing high definition video data represented by a VSB symbol constellation, said data having a data frame format constituted by a succession of data frames comprising a field sync component prefacing a plurality of data segments having an associated segment sync component, said method comprising the further steps of:

recovering said segment sync component; and generating said second control signal as a function of the condition of said sync component produced by said recovering step.

* * * * *